United States Patent

Ancey et al.

(10) Patent No.: US 7,304,358 B2
(45) Date of Patent: Dec. 4, 2007

(54) MOS TRANSISTOR WITH A DEFORMABLE GATE

(75) Inventors: Pascal Ancey, Revel (FR); Nicolas Abele, Paris (FR); Fabrice Casset, Tencin (FR)

(73) Assignees: STMicroelectronics S.A., Montrouge (FR); Commissariat a l'Energie Atomique, Paris (FR)

( * ) Notice: Subject to any disclaimer, the term of this patent is extended or adjusted under 35 U.S.C. 154(b) by 7 days.

(21) Appl. No.: 11/227,624

(22) Filed: Sep. 15, 2005

(65) Prior Publication Data

US 2006/0054984 A1   Mar. 16, 2006

(30) Foreign Application Priority Data

Sep. 16, 2004  (FR) .................................. 04 52070

(51) Int. Cl.
*H01L 29/84*    (2006.01)
(52) U.S. Cl. .................. 257/415; 257/254; 257/416; 257/417; 257/418; 257/419; 257/420; 257/522; 257/599; 257/E29.324
(58) Field of Classification Search ................ None
See application file for complete search history.

(56) References Cited

U.S. PATENT DOCUMENTS 5,818,093 A * 10/1998 Gutteridge et al. ......... 257/417
6,211,558 B1 * 4/2001 Ismail et al. ................ 257/419

FOREIGN PATENT DOCUMENTS

FR    2827270 A    1/2003

OTHER PUBLICATIONS

French Search Report from corresponding French Application No. 0452070, filed Sep. 15, 2004.
Pott, V. et al., *The Suspended-Gate MOSFET (SG-MOSFET): A Modeling Outlook for the Design of RF MES Switches and Tunable Capacitors*, CAS 2003, International Semiconductor Conference, Oct. 9-13, 2001, Sinaia Romania, vol. 1, 2001, pp. 137-140, XP001153332.
Nathanson, H.C. et al., *The Resonant Gate Transistor*, IEEE Transactions on Electron Devices IEEE Inc., New York, vol. ED-14, No. 3, Mar. 1967, pp. 117-133, XP001040818.
Chou, T.,K., et al., *Fabrication of Out-of-Plane Curved Surfaces in SI by Utilizong RIE Lag*, MEMS 2002, Las Vegas, NV, Jan. 20-24, 2002, IEEE International Micro Electro Mechanical Systems Conference, vol. Conf. 15, 2002, pp. 145-148, XP010577616.

* cited by examiner

*Primary Examiner*—Minhloan Tran
*Assistant Examiner*—Leslie Pilar Cruz
(74) *Attorney, Agent, or Firm*—Lisa K. Jorgenson; James H. Morris; Wolf, Greenfield & Sacks, P.C.

(57) ABSTRACT

A MOS transistor with a deformable gate formed in a semiconductor substrate, including source and drain areas separated by a channel area extending in a first direction from the source to the drain and in a second direction perpendicular to the first one, a conductive gate beam placed at least above the channel area extending in the second direction between bearing points placed on the substrate on each side of the channel area, and such that the surface of the channel area is hollow and has a shape similar to that of the gate beam when said beam is in maximum deflection towards the channel area.

7 Claims, 3 Drawing Sheets

MOS TRANSISTOR WITH A DEFORMABLE GATE

BACKGROUND OF THE INVENTION

1. Field of the Invention

The present invention relates to a MOS transistor with a deformable gate. Such a transistor may especially be used as a pressure sensor, an acceleration sensor, or as a resonator.

2. Discussion of the Related Art

FIG. 1 is a perspective view of a known MOS transistor with a deformable gate. This type of transistor is described in patent WO03/078299 of the Ecole Polytechnique Fédérale de Lausanne entitled "PROCESS FOR MANUFACTURING MEMs", published on Sep. 25, 2003. This transistor is formed in and above a semiconductor substrate 1. A gate beam 2 bears at each end on pillars 3 and 4 placed on substrate 1. Source/drain areas 5 and 6 formed in substrate 1 are placed on each side of beam 2. The substrate portion located under beam 2 comprises a channel area 7.

FIGS. 2 and 3 are cross-section views of FIG. 1 along the longitudinal axis of gate beam 2. In the quiescent state, as shown in FIG. 2, beam 2 is horizontal. The beam is capable of deforming under the action of a mechanical, electrostatic, or electromagnetic force. When the beam deforms, it curves in an "arc", as shown in FIG. 3. The central portion of gate beam 2 is close to channel area 7 while the ends of the beam are remote from the channel area.

The beam comprises a conductive layer that can be set to a determined voltage and forms the gate of the MOS transistor having, as a source and drain, areas 5 and 6 and, as a channel area, area 7.

When the beam is horizontal, the gate-substrate capacitance is small. The transistor then exhibits a high threshold voltage. The more the beam deforms and comes closer to the substrate, the more the transistor threshold voltage decreases. Accordingly, for a given biasing of the gate and of the source/drain areas, the more gate beam 2 is deformed, the higher the current flowing through the transistor. Thus, the motions of the gate beam translate as current variations through the transistor.

However, the current flowing through channel area 7 is not uniform on this entire area. Since the distance between beam 2 in the deflected state and channel area 7 is smaller in the central portion of the channel area than outside of this area, close to pillars 3 and 4, the current density is maximum at the center of the channel area and minimum close to the pillars. Accordingly, the major part of the current flowing through the transistor runs through the central portion of the channel. The lateral portions then play a minor function in the detection of the beam deformation.

SUMMARY OF THE INVENTION

An object of the present invention is to provide a MOS transistor with a deformable gate which enables more finely detecting the motions of its gate.

Another object of the present invention is to provide a method for manufacturing such a MOS transistor with a deformable gate.

To achieve these and other objects, the present invention provides a MOS transistor with a deformable gate formed in a semiconductor substrate, comprising source and drain areas separated by a channel area extending in a first direction from the source to the drain and in a second direction perpendicular to the first one, a conductive gate beam placed at least above the channel area extending in the second direction between bearing points placed on the substrate on each side of the channel area, in which the surface of the channel area is hollow and has a shape similar to that of the gate beam when said beam is in maximum deflection towards the channel area.

According to a variation of the above-described transistor, the transistor further comprises a gate oxide layer covering the channel area.

According to a variation of the above-described transistor, the beam is made of doped polysilicon.

According to a variation of the above-described transistor, the beam is a metal, titanium, and silicon nitride tri-layer.

According to a variation of the above-described transistor, the source and drain areas have a curved shape identical to that of the channel area.

The present invention also provides an oscillating circuit comprising a transistor with a deformable gate such as described hereabove, the transistor conducting a current which is provided to an amplifier, the amplifier output corresponding to the circuit output being connected to the gate beam of the transistor via a capacitor, the gate beam being connected to a bias voltage.

The present invention further provides a method for manufacturing a transistor with a deformable gate comprising the steps of: forming by implantation in a substrate source and drain areas separated by a channel area; depositing a protection layer on the substrate; forming an opening in the protection layer at least above the channel area; performing a chem.-mech. polishing of the previously-obtained structure, the etch method of the polishing being such that it etches the substrate more than the protection layer, whereby a recess is formed in the substrate under said opening; eliminating the protection layer; forming a gate oxide layer on the substrate; forming a first sacrificial portion in said recess; depositing and etching a sacrificial layer whereby a second sacrificial portion covers the first sacrificial portion; forming a conductive gate beam running above the second sacrificial portion and bearing on the gate oxide layer on each side of the recess; eliminating the first and second sacrificial portions.

The foregoing objects, features, and advantages of the present invention will be discussed in detail in the following non-limiting description of specific embodiments in connection with the accompanying drawings.

DETAILED DESCRIPTION

Figure 1:
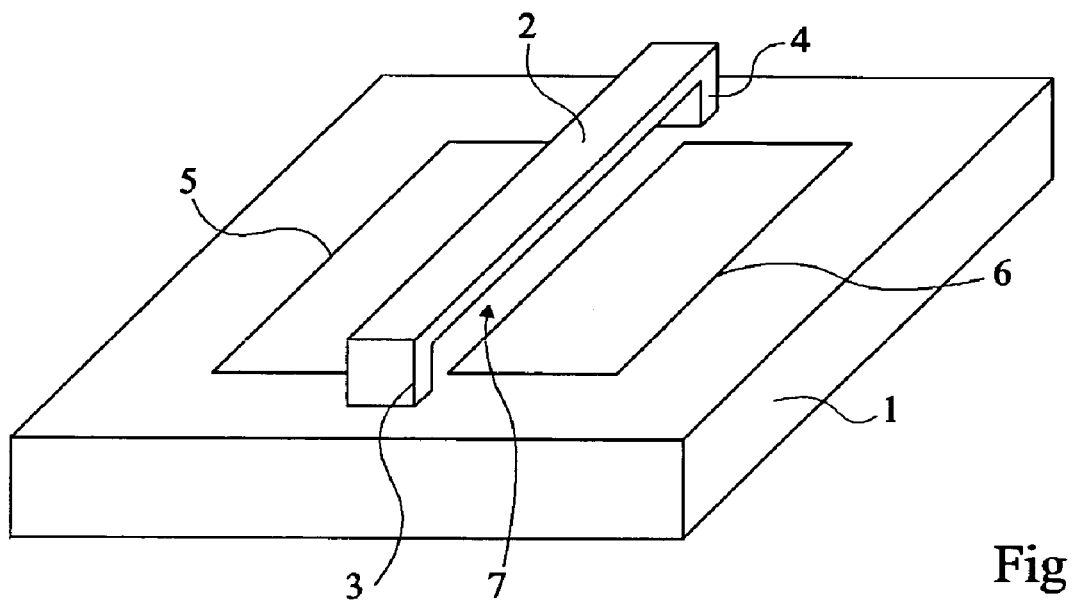
FIG. 1 is a perspective view, previously described, of a MOS transistor with a deformable gate.
Figure 2:
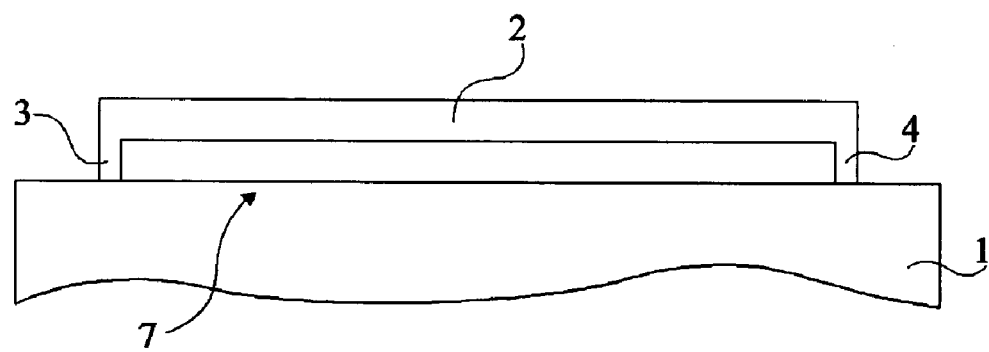
FIGS. 2 and 3 are cross-section views of the transistor shown in FIG. 1 in two different states.
Figure 3:
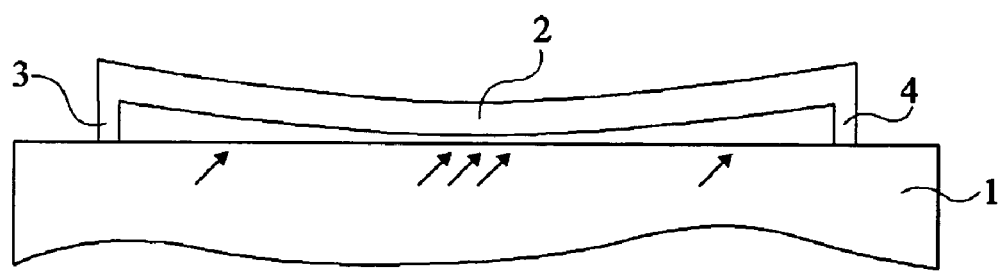

For clarity, the same elements have been designated with the same reference numerals in the different drawings, and further, as usual in the representation of integrated circuits, FIGS. 1, 2, 3, 4, 5, 6, 7, and 9A to 9D are not drawn to scale.

Figure 4:
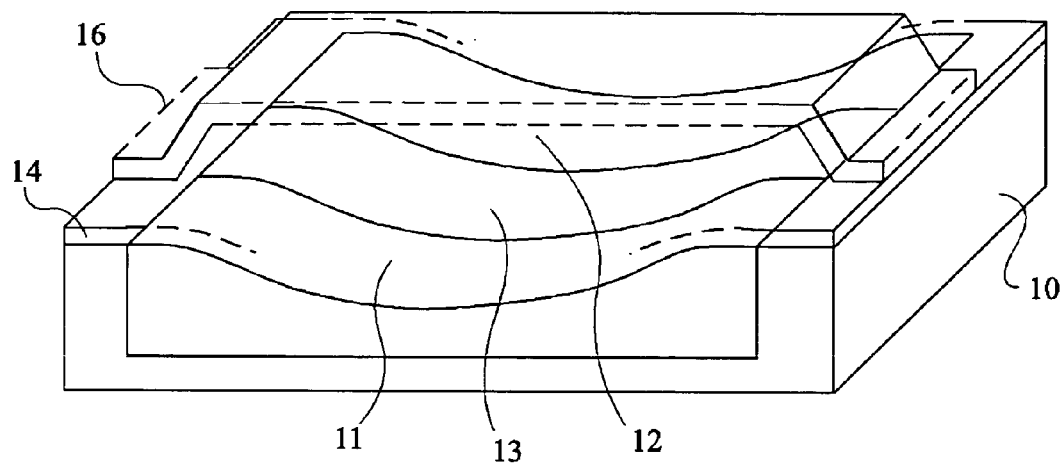
FIG. 4 is a perspective view of a MOS transistor with a deformable gate according to the present invention.

FIG. 4 is a perspective view of a MOS transistor with a deformable gate according to the present invention. The transistor is formed in a semiconductor substrate 10. Two source/drain areas 11 and 12 separated by a channel area 13 are formed in substrate 10. A thin silicon oxide layer 14, partially shown, covers substrate 10. The surface of channel area 13 and source/drain areas 11 and 12 is curved and forms a groove. A gate beam 16, shown in dotted lines, is placed above channel area 13 and bears on substrate 10 on each side of the channel on the groove edges.

According to an aspect of the present invention, the depth of the groove formed by the surface of the channel area continuously increases from the edges to the bottom of the groove, or in other words, from the ends to the central portion of the channel area.

In the following description, it will be considered that the width of the channel area corresponds to the distance separating the source/drain areas, the length of the channel area being measured parallel to the surfaces of contact between the channel area and the source/drain areas. By analogy, the beam length will be taken to be parallel to the length of the channel area, and the beam width will be measured parallel to the width of the channel area.

It should be noted that the beam width may be identical or greater than that of the channel area.

Further, in the transistor example shown in FIG. 4, source/drain areas 11 and 12 have a shape identical to that of channel area 13. However, it should be noted that source/drain areas 11 and 12 may have a different shape. Only the surface of channel area 13 must be curved in a groove.

As a non-limiting example, the geometric features of the elements forming the transistor shown in FIG. 4 are the following:

Channel area, length: 5-50 μm
  width: 1-20 μm
Gate beam, length: 5-60 μm
  width: 1-30 μm Maximum interval between the beam and the channel area: from 100 nm to 1 μm.

Figure 5:
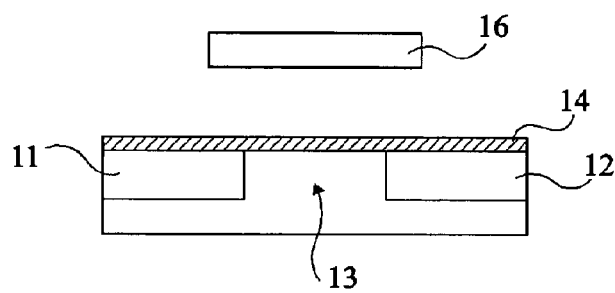
FIG. 5 is a cross-section view of the transistor shown in FIG. 4.

FIG. 5 is a cross-section view of the transistor shown in FIG. 4 along a plane perpendicular to the longitudinal axis of gate beam 16 and substantially at its middle. The interval between gate beam 16 and channel area 13 is likely to vary according to the forces applied on gate beam 16.

Figure 6:
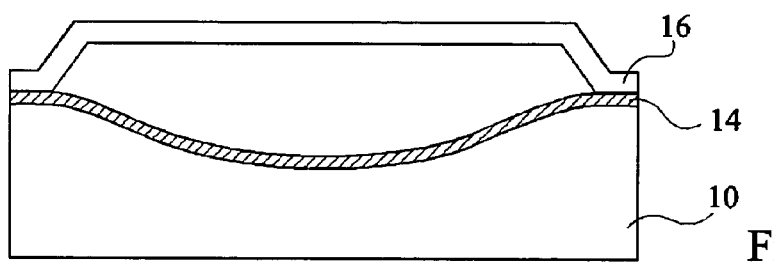
FIGS. 6 and 7 are cross-section views of the transistor shown in FIG. 4 in two different states.
Figure 7:
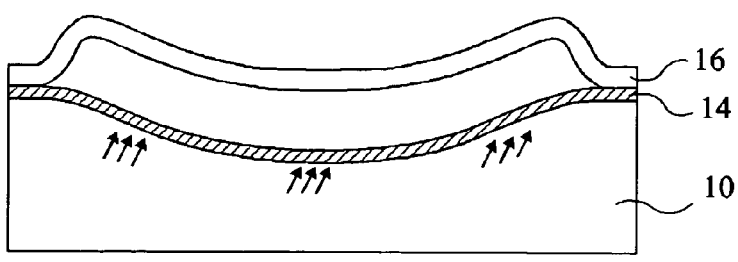

FIGS. 6 and 7 are cross-section views of the transistor shown in FIG. 4 along the longitudinal axis of gate beam 16. When no force is applied on gate beam 16, the beam is horizontal, as shown in FIG. 6. When a force is applied on beam 16, said beam deforms and comes closer to channel area 13. In the example shown in FIG. 7, the beam deformation is significant. The groove shape of the surface of channel area 13 substantially corresponds to the shape of beam 16 when its deflection is maximum. Due to this curvature of the channel area, the interval between gate beam 16 and channel area 13 varies little between the central portion and the lateral portions of channel area 13. Accordingly, the current is substantially identical along the entire length of the channel area. This increases the transistor sensitivity.

An advantage of the MOS transistor with a deformable gate according to the present invention is that it more finely detects the motions of its gate.

A MOS transistor with a deformable gate according to the present invention may be used in various applications. Such a transistor may be used in a device such as an accelerometer or may form an element of a circuit such as an oscillating circuit, as described hereafter.

Figure 8:
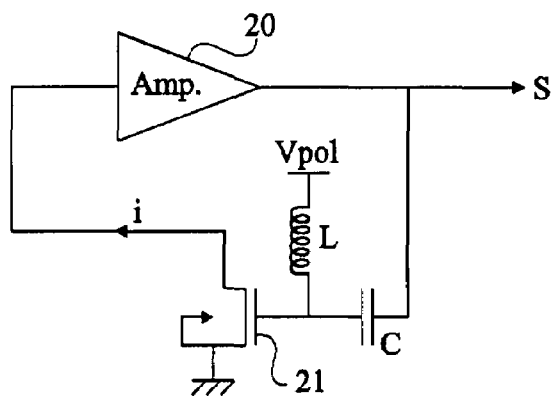
FIG. 8 is a diagram of an oscillating circuit using a MOS transistor with a deformable gate according to the present invention.

FIG. 8 is a diagram of an oscillating circuit comprising a transistor with a deformable gate according to the present invention. This circuit is formed of an amplifier 20, of a transistor with a deformable gate 21 according to the present invention, of a coil L, and of a capacitor C. The output of amplifier 20, forming output S of the oscillating circuit, is connected to the gate beam of transistor 21 via capacitor C. Coil L is placed between a bias voltage Vpol and the gate beam of transistor 21. Current i flowing through transistor 21 is provided at the input of amplifier 20. The transistor is in this example of NMOS type, its source and its substrate being grounded, its drain being connected to the input of amplifier 20.

The voltage between the substrate and the gate beam of the transistor is equal to voltage Vpol, which is chosen to be relatively high so that the beam is strongly deformed. The function of capacitor C is to filter the D.C. components of the voltage provided by amplified 20. The A.C. components of the voltage provided by amplifier 20 are amplified on the transistor gate beam. The transistor operates as a resonator. The beam starts resonating when the voltage applied thereon varies at a determined frequency which will be called hereafter the resonance frequency fr. When the voltage applied on the beam has a frequency different from fr, the beam almost does not vibrate. Frequency fr depends on the geometric features of the beam and on bias voltage Vpol. When it is used as a resonator, the transistor is equivalent to a band-pass filter.

When the oscillating circuit is powered on, it starts naturally oscillating. The voltage initially provided by amplifier 20 is substantially zero. Only noise comes out of the amplifier. The noise components having a frequency close to frequency fr pass through a transistor operating as a filter. A current i varying at frequency fr is provided to the amplifier which then supplies the transistor with a voltage varying at frequency fr. After several loops between the amplifier and the transistor, current i, initially of very small amplitude, progressively increases to reach a maximum amplitude. The voltage provided at output S has a set amplitude and varies at resonance frequency fr.

A transistor according to the present invention may be obtained by various methods. An example of a method is described hereafter in relation with FIGS. 9A to 9D.

Figure 9A:
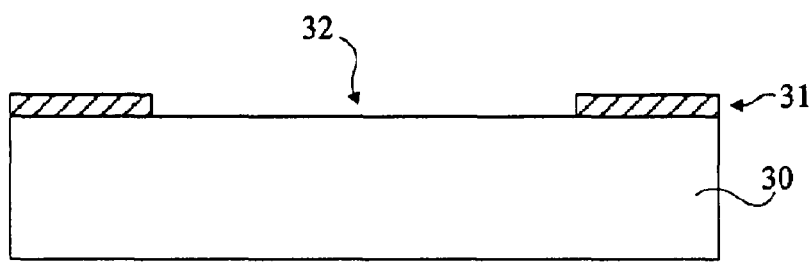
FIGS. 9A to 9D are cross-section views of structures obtained at the end of successive steps of a method for manufacturing a transistor with a deformable gate according to the present invention.

In an initial step, illustrated in FIG. 9A, a semiconductor substrate 30 is covered with a protection layer 31 formed, for example, of nitride or silicon oxide. An opening 32 is formed in protection layer 31. The opening may have various shapes in top view. It may, for example, be rectangular.

Figure 9B:
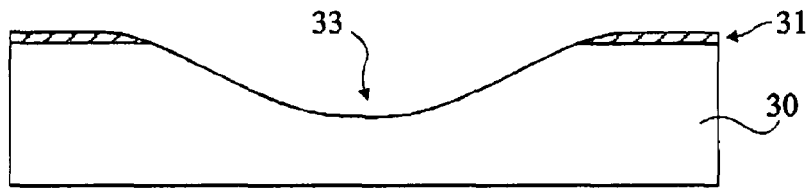

At the next step, illustrated in FIG. 9B, a chem.-mech. polishing of the previously-formed structure is carried out by selecting an etch product preferentially etching semiconductor substrate 30 rather than protection layer 31. When opening 32 is large enough, a "basin"-shaped recess 33 forms in substrate 30 under opening 32. Protection layer 31 is then removed.

Source/drain areas are formed by ion implantation at the end of this step or possibly prior to the forming of basin 32.

Figure 9C:
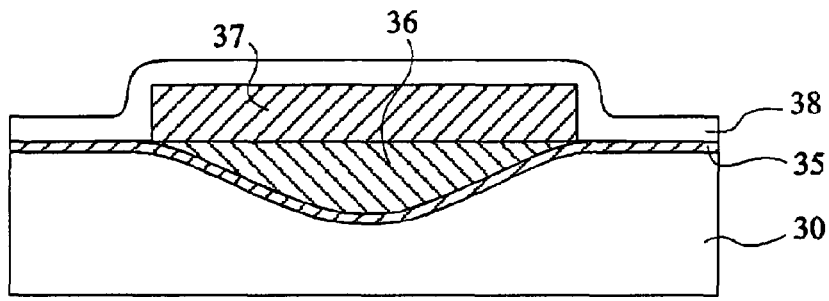

At the next step, illustrated in FIG. 9C, a thin gate oxide layer 35 is grown on substrate 30.

A first sacrificial layer is then deposited over the entire previously-obtained structure, after which a chem.-mech. polishing of this sacrificial layer is performed to expose the portions of gate oxide layer 35 surrounding recess 33. Recess 33 is then filled with a first sacrificial portion 36.

A sacrificial layer is deposited again and etched to keep a second sacrificial portion 37 placed above first sacrificial portion 36.

A gate beam 38 is then formed above sacrificial portion 37, the beam bearing on gate oxide layer 35 on each side of sacrificial portion 37. This gate beam may be conventionally obtained by a deposition, followed by an etch, of one or several layers of materials. The beam is for example formed of polysilicon, preferably doped, or of a metal/titanium/silicon nitride tri-layer. The beam width is provided to be smaller than that of the recess so that sacrificial portion 37 is visible on each side of gate beam 38.

Figure 9D:
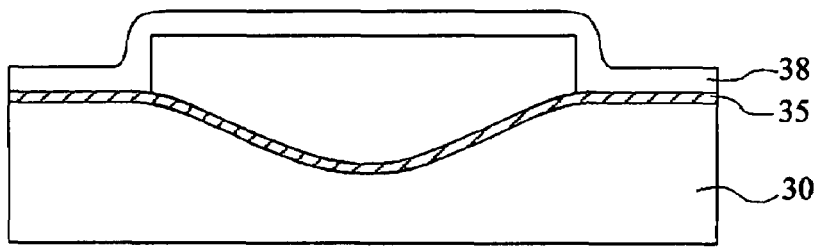

At the next step, illustrated in FIG. 9D, sacrificial portions 36 and 37 are eliminated, for example, by etching.

Of course, the present invention is likely to have various alterations, modifications, and improvements which will readily occur to those skilled in the art. In particular, those skilled in the art may devise other methods for manufacturing a transistor with a deformable gate according to the present invention.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A MOS transistor with a deformable gate formed in a semiconductor substrate, comprising source and drain areas separated by a channel area extending in a first direction from the source to the drain and in a second direction perpendicular to the first one, a conductive gate beam placed at least above the channel area extending in the second direction between bearing points placed on the substrate on each side of the channel area, wherein the surface of the channel area is hollow and has a shape similar to that of the gate beam, whereby current flowing through the transistor is substantially identical along the length of the channel area when said beam is in maximum deflection towards the channel area.

2. The transistor of claim 1, further comprising a gate oxide layer covering the channel area.

3. The transistor of claim 1, wherein the beam is made of doped polysilicon.

4. The transistor of claim 1, wherein the beam is a metal, titanium, and silicon nitride tri-layer.

5. The transistor of claim 1, wherein the source and drain areas-have a curved shape identical to that of the channel area.

6. An oscillating circuit comprising the transistor with a deformable gate of claim 1, the transistor conducting a current which is provided to an amplifier, the amplifier output corresponding to the circuit output being connected to the gate beam of the transistor via a capacitor, the gate beam being connected to a bias voltage.

7. The transistor of claim 1, wherein a distance between the channel area and the gate is substantially uniform alone the length of the channel area when said beam is in maximum deflection towards the channel area.

* * * * *